Sept. 29, 1970 W. T. THOMPSON 3,531,732

DIFFERENTIAL AGC CIRCUIT

Filed July 3, 1969

INVENTOR.
Wallace T. Thompson
BY
Edward J. Coleman
AGENT.

United States Patent Office 3,531,732

Patented Sept. 29, 1970

3,531,732

DIFFERENTIAL AGC CIRCUIT

Wallace T. Thompson, East Amherst, N.Y., assignor to Sylvania Electric Products Inc., a corporation of Delaware Filed July 3, 1969, Ser. No. 838,756
Int. Cl. H03g 3/30
U.S. Cl. 330—29 9 Claims

ABSTRACT OF THE DISCLOSURE

An automatic gain control circuit in which the input terminal of a control amplifier is coupled to the signal source for a circuit amplifier, and the output terminal of the control amplifier is connected to a lower impedance tap of the output load for the circuit amplifier. The gain of the control amplifier is varied in response to a biasing signal to thereby linearly control the gain of the circuit amplifier over an extended dynamic range.

BACKGROUND OF THE INVENTION

This invention relates generally to amplifier circuits, and more particularly to automatic gain control (AGC) circuits for radio frequency amplifiers of wide dynamic range, especially transistorized amplifiers.

It is common practice to provide radio receivers with automatic gain control circuits to maintain the amplitude of the signal applied to the detector as nearly constant as possible over a relatively wide range of variation in the amplitude of the received signal. In transistorized receivers, this is usually accomplished by using a portion of the rectified received radio signal to produce a direct current voltage, of appropriate polarity, which is proportional to the average value of the signal and applying it to the transistor base electrodes of the radio frequency, intermediate frequency and/or converter sections of the receiver to control the gain thereof inversely with respect to signal strength. That is, a large input signal produces a large AGC signal, the polarity of which is such that when applied to bias the base electrode of a transistor amplifier stage, the emitter current is reduced, thus decreasing the gain of the amplifier and reducing the amplitude of the signal applied to the detector. This method of gain control may be called "reverse biasing."

Exclusive use of the "reverse bias" method to achieve gain control presents a number of problems and is especially unsuitable in wide dynamic range receivers and amplifiers. When the AGC signal acts to alter the bias conditions in controlling transistor gain, this is reflected as a shift in bandwidth in center frequency due to changes in the input and output impedances. For example, in a common emitter stage, decreasing $I_e$ to reduce the gain results in an increase in input impedance and reduction of the bandwidth of a parallel tuned circuit (due to increased Q) and an upward shift of the center frequency. The dynamic range of the amplifier is thus compressed by detuning as the operating point of the transistor approaches either cut-off or saturation.

In low level RF stages, the nonlinearity introduced by the reduction of emitter current bias in the presence of a high input signal results in excessive intermodulation distortion beyond approximately 20 to 30 db of gain control. A known method of reducing this distortion is to control gain by varying the negative or degenerative feedback of the amplifier; prior art negative feedback approaches, however, have a relatively limited gain control range and do not cope with the problem of input and output impedence variations.

A solution to the above noted problem is provided by an AGC circuit described in U.S. Pat. No. 3,368,156, issued February 6, 1968, and assigned to the assignee of the present application. Briefly, the patented circuit provides improved gain control performance by shunting the input to common terminal signal path of a circuit amplifier stage with a control amplifier which operates in response to a D.C. biasing signal to control the gain of the circuit amplifier by a combination of signal shunting, negative feedback, and reverse biasing. More specifically, an AGC signal is applied to control the operating point of the control amplifier to thereby vary its gain in response to changes in the magnitude of the AGC signal. The control amplifier is thereby operative to vary both the degenerative signal feedback of the circuit amplifier and the direct current bias voltage at the common terminal thereby to control the gain of the circuit amplifier in a reciprocal manner with respect to the gain variation of the control amplifier.

Since the input of the control amplifier is coupled to the signal input of the circuit amplifier, the increase in control amplifier gain with reduction in circuit amplifier gain results in a relatively constant input impedence being retained at the common input terminal. Further, this circuit configuration enables active degeneration of the circuit amplifier stage whereby the negative feedback between the input and common terminals is controlled without phase inversion to insure linearity of operation. In addition, D.C. bias variations are employed cooperatively with the negative feedback to provide a wider range of control than that attainable with degenerative control alone.

In a transistorized embodiment of the patented circuit, these improvements in the control characteristics of a circuit amplifier stage are achieved by addition of a control transistor, the emitter and base electrodes of which are respectively coupled to the emitter and base electrodes of a transistor in the circuit amplifier stage. Application of a direct current AGC voltage as base bias for the control transistor is thereby effective to control the signal impedance in the emitter circuit of the amplifier transistor and also to provide a direct current circuit action of reverse biasing the amplifier transistor. In one circuit embodiment, a single transistor common emitter amplifier is controlled by a second transistor, base biased in response to AGC voltage, having its base electrode coupled to the input terminal of the common emitter amplifier, its collector electrode coupled to RF ground, and its emitter electrode coupled directly to the emitter electrode of the amplifier transistor so as to share its emitter resistor.

In a second circuit embodiment, a cascode amplifier comprising a first transistor connected in a common emitter configuration and a second transistor connected as a common base is controlled by a third transistor, of common base configuration, which is connected so as to control the gain of the second transistor. In this circuit, the input signal is connected from the collector of the first transistor to the emitter electrodes of the second and third transistors. The junction of the emitter electrodes of the second and third transistors is also connected to the base electrode of the first transistor thereby to increase the forward bias of the first transistor in the presence of strong input signals, thus preventing overdriving of the transistor with resulting clipping and distortion. The cascode amplifier combines high input impedance, high output impedance, and good isolation between input and output circuits, thereby eliminating the need for neutralizing circuitry.

It has been found, however, that the excellent dynamic range and linearity of performance of the above described patented circuit are not sufficient to meet the stringent requirements of some of the more recently evolved extremely wide dynamic range radio applications. One reason for this limited performance is the fact that the bias in the circuit amplifier drops to essentially zero at a time when it is called upon to deliver a relatively high output power, and as a consequence the envelope of the output signal waveform becomes quite distorted. Further, the control amplifier is not effective enough as a short to RF ground to protect the circuit amplifier from RF overdrive.

SUMMARY OF THE INVENTION

Accordingly, it is an object of the present invention to provide an improved, relatively distortion-free automatic gain control circuit.

It is another object of the invention to provide a gain control circuit for an amplifier which will provide improved linearity of performance and predictability of the exact amount of AGC over an extended dynamic range.

Briefly, these objects are attained by a circuit combination comprising first and second amplifiers having respective input terminals coupled to an input signal source and respective output terminals coupled to different impedance terminals of a load circuit. The circuit further includes means for applying a control signal to control the gain of the first amplifier.

BRIEF DESCRIPTION OF THE DRAWINGS

This invention will be more fully described hereinafter in conjunction with the accompanying drawings, in which.

DESCRIPTION OF PREFERRED EMBODIMENT

For a better understanding of the present invention, together with other and further objects, advantages and capabilities thereof, reference is made to the following disclosure and appended claims in connection with the above-described drawings.

As will become apparent from the following description, the present invention comprises an improved variation of the automatic gain control circuits described by the aforementioned U.S. Pat. No. 3,368,156. More specifically, the distortion problem at extended dynamic ranges is solved by taking advantage of the differential action of the control and circuit amplifiers and the fact that under high AGC conditions, the bias current has transferred to the control amplifier. With a high bias current, the control amplifier is capable of a high power output with good linearity. In addition, there is less voltage swing on the output of the control amplifier, thereby further contributing to higher output capability. In accordance with the present invention, this power output capability of the control amplifier is utilized by tapping its output into the load crcuit resonator or transformer so that the input signal is no longer shunted to ground, but rather is shifted to a lower gain tap at the amplifier output.

Figure 1:
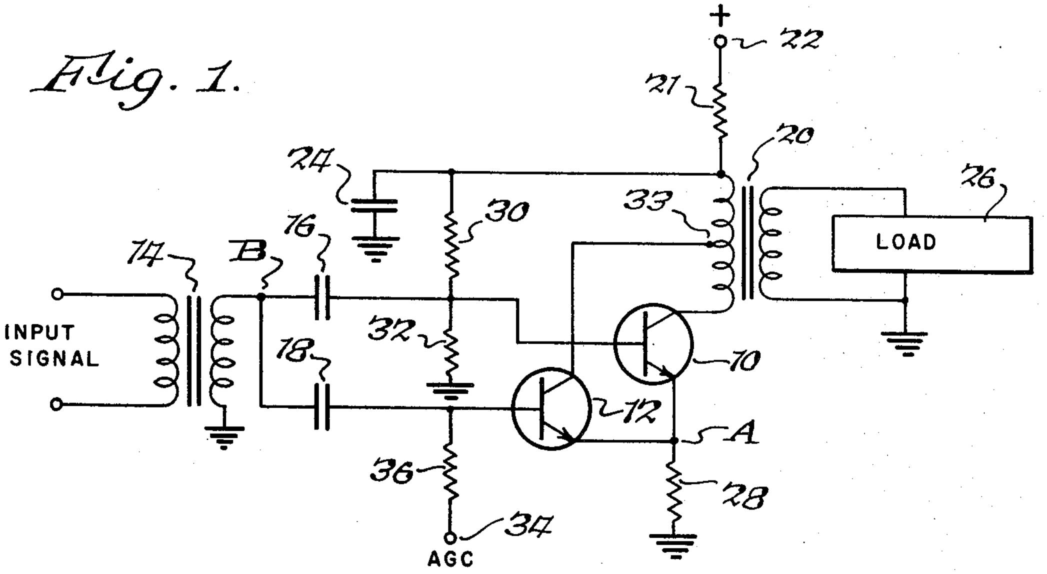
FIG. 1 is a schematic diagram of a transistorized circuit embodiment of the automatic gain control circuit of the invention in circuit with a common emitter amplifier.

Referring to FIG. 1, a first embodiment of the invention is shown comprising a common emitter amplifier including transistor 10 in combination with a control amplfier including a transistor 12, also connected in a common emitter configuration. Input signals, from a source such as an antenna or radio frequency amplifier are applied across the terminals of the primary winding of an impedance matching transformer 14. One terminal of the secondary winding of the transformer is connected in parallel through coupling capacitors 16 and 18 to the base electrodes of transistors 10 and 12, respectively, and the other terminal is connected to ground. The collector electrode of transistor 10 is connected to one end terminal of the primary winding of an impedance matching output transformer 20, the other end terminal of the primary being connected via a signal decoupling resistor 21 to a source of positive direct current voltage, represented by terminal 22, and via signal bypass capacitor 24 to ground; this connection provides a fixed supply voltage for the collector of transistor 10. A load 26, which may be another amplifier stage or a detector, is connected across the secondary winding of transformer 20.

The emitter electrode of transistor 10 is connected through a resistor 28 to ground, and the base is connected to a voltage divider network including a resistor 30 connected in series with resistor 21 and source 22, and a resistor 32 connected between the base electrode and ground. The values of resistors 30 and 32 are selected so as to keep the D.C. bias voltage at the base of transistor 10 relatively constant when AGC is applied to the amplifier. The emitter of transistor 12 is connected directly to the emitter of transistor 10, thereby sharing emitter resistor 28 with transistor 10. The collector electrode of transistor 12 is connected to a tap 33 of the primary winding of transformer 20 and via a portion of that winding and resistor 21 to the positive D.C. voltage source at terminal 22. A source of AGC voltage, represented by terminal 34, which may be obtained from the filtered output of a subsequent detector stage, is applied through a resistor 36 to the base electrode of transistor 12 to thereby control the operating point of transistor 12 and vary its gain in response to changes in magnitude of the AGC signal.

In operation, when the AGC voltage at terminal 34 is at its minimum level, control transistor 12 is biased to cut-off, thereby allowing all the signal current to flow through the common emitter amplifier, transistor 10. Consequently, transistor 10 is operating in its maximum gain condition. The base-emitter junction of transistor 10 is forward-biased by the positive voltage established at its base electrode by voltage divider resistors 30 and 32. For example, if the base of transistor 10 is at $+3.6$ $v._{dc}$, the voltage at the emitter, junction point A, will be about $+3.0$ $v._{dc}$, allowing for an approximately 0.6 $v._{dc}$ base-emitter drop.

As the AGC voltage at the base of transistor 12 is increased, approaching the fixed D.C. bias voltage at the base of transistor 10, transistor 12 will begin to conduct. With transistor 12 conducting, linear gain control of the common emitter amplifier (transistor 10) is provided by means of three cooperating functions of the common emitter circuits. First, since the base of transistor 12 is coupled to the input signal source, the control transistor will shunt a portion of the signal current to tap 33 of the load circuit matching transformer. Second, as the AGC voltage becomes more positive with increasing signal strength, the D.C. voltage at junction point A increases correspondingly, thereby tending to reverse-bias transistor 10, which has a fixed D.C. base bias voltage. Hence, increasing the AGC results in a decrease in the base-emitter D.C. voltage differential, $V_{BE}$ in transistor 10. This reduces the emitter current, $I_e$, of transistor 10, thereby reducing its signal gain. As the third aspect of amplifier control, active negative feedback is increased with increasing AGC by varying the effective signal impedance or resistance to ground at the emitter of transistor 10, in response to the AGC signal, to establish the proper amount of signal degeneration. The reverse biasing and negative feedback control functions are discussed in detail in the aforementioned Pat. No. 3,368,156. The function of shunting the signal to a tap of the load circuit, however, is an improvement feature of the present invention and thus will be discussed in some detail hereinafter.

In view of the shunt arrangement of the transistors with their signal inputs coupled together at a junction point B and their emitter electrodes connected at a junction point A so as to share a common emitter resistor 28, the gains of transistors 10 and 12 will vary in a reciprocal manner. That is, as the gain of transistor 12 is varied from cut-off to the "full on" condition in response to the base applied AGC voltage, the gain of transistor 10 will vary from "full on" to cut-off. Of course, negative feedback alone is not sufficient to extend the gain control range of transistor 10 to cut-off; this is accomplished by the reverse biasing action. That is, since the applied negative feedback is a function of the gain of the control transistor 12, which will never reach the ideal maximum gain level of unity, the maximum negative feedback obtainable via transistor 12 will not in itself be sufficient to reduce the gain of transistor 10 to cut-off. Hence, once the maximum gain of transistor 12 is reached, as determined by its beta characteristics, further increase in AGC voltage results in an increase in the D.C. voltage at junction A to thereby reduce the gain of transistor 10 to cut-off by reverse biasing. In this state, all of the input signal current is shunted to tap 33 of matching transformer 20. This is the state wherein the present invention provides a significant improvement over the patented circuit arrangement, in which the input signal was shunted to ground via transistor 12.

More specifically, whereas the full load circuit impedance is across the collector and base electrodes of circuit amplifier transistor 10, a much lower load impedance appears across tap 33 and ground at the collector output of control transistor 12. As a result of the lower load impedance at tap 33, a lower voltage swing will appear at the collector of transistor 12, thereby making it a correspondingly lower gain amplifier than circuit amplifier transistor 10, As the power output of an ideal class A or class B amplifier is approximately inversely proportional to load impedance, the lower gain amplifier transistor 12 provides an increased power handling capability as compared to the circuit amplifier transistor 10. Accordingly, the differential AGC action of the circuit combination shown in FIG. 1 provides an extended power handling capability and improved linearity at high signal levels, and maximum AGC, thereby providing a much wider dynamic range. A further advantage derived from shunting the signal to a lower gain tap on the load is that the amount of AGC of the amplifier stage is completely predictable by means of the impedance ratio of the two collector load terminations; e.g., a 100:1 impedance ratio from a 10:1 matching transformer turns ratio would give 20 db of AGC.

Figure 2:
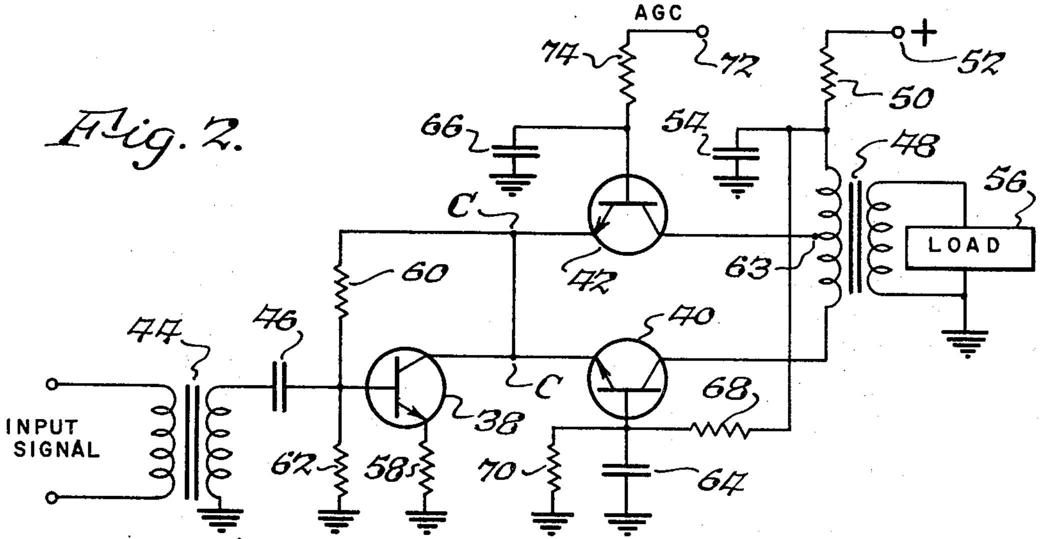
FIG. 2 is a schematic diagram of a transistorized circuit embodiment of the automatic gain control circuit of the invention arranged to control a cascode amplifier.

Referring now to FIG. 2, a second embodiment of the invention is shown as applied to the control of a cascode amplifier. The cascode amplifier comprises a transistor 38 connected in a common emitter configuration and a transistor 40 connected as a common base amplifier. For some applications, it may be preferable to use a field effect transistor (FET) for transistor 38. The gain of transistor 40 is controlled by another common base transistor amplifier 42 in an analogous manner to that in which transistor 10 is controlled by transistor 12 in the circuit of FIG. 1.

The input signal is applied across the primary winding of an impedance matching transformer 44, one terminal of the secondary of which is connected to the base electrode of transistor 38 through a coupling capacitor 46, with the other terminal connected to ground. The collector electrode of transistor 38 is directly connected to the emitter electrodes of both of transistors 40 and 42 (junction point C), and the collector electrode of transistor 40 is connected to one terminal of the primary winding of an impedance matching output transformer 48, the other terminal of which is connected via a signal decoupling resistor 50 to a source of positive direct current voltage, represented by terminal 52, and via a signal bypass capacitor 54 to ground, this connection providing a relatively fixed supply voltage at the collector of transistor 40. A load 56 is connected across the secondary winding of transformer 48.

The emitter electrode of transistor 38 is connected through a resistor 58 to ground, and the base electrode is connected to a bias source provided by a voltage divider comprising resistors 60 and 62. Resistor 60 is connected between the base of transistor 38 and junction point C, and resistor 62 is connected between the base of transistor 38 and ground. The base electrodes of transistors 40 and 42 are connected to ground via coupling capacitors 64 and 66, respectively, and the collector electrode of transistor 42 is connected to a tap 63 of the primary winding of transformer 48 and via a portion of that winding and resistor 50 to the positive D.C. voltage source at terminal 52. A fixed bias voltage is maintained at the base of transistor 40 by a voltage divider comprising a resistor 68, connected in series with resistor 50 to source 52, and a resistor 70 connected between the base of transistor 40 and ground. The base bias, and hence operating point and gain, of transistor 42 is controlled by a source of AGC voltage applied at terminal 72 through a resistor 74 to the base electrode of this transistor.

With reference to the cascode amplifier stage, transistor 40, being a common base amplifier, provides a very high output impedance for the stage but a very low input impedance as the collector signal load for the common emitter amplifier transistor 38. With such a collector load, transistor 38 has a very low voltage gain, typically less than unity. Hence, transistor 38 is basically a current amplifier which serves to transform the low input impedance of transistor 40 to a much higher value (by approximately the beta multiplication of transistor 38). Also, with such degeneration of the voltage gain of the common emitter amplifier, the signal feedback through the collector-to-base capacitance of transistor 38 is considerably reduced, thereby insuring stability of operation and eliminating the need for neutralization of unilateralization over a wide frequency range of tuned operation.

In a typical application, transistors 40 and 38 are connected in series between +12 $v_{dc}$, at terminal 52, and ground. Transistor 40 is forward biased at approximately +3.6 $v_{dc}$ from the voltage divider comprising resistors 68 and 70, the values of which, as mentioned above, are selected so as to keep the base bias relatively constant when AGC action occurs. With +3.6 $v_{dc}$ at the base of transistor 40, junction point C will be at approximately +3.0 $v_{dc}$. The voltage divider comprising resistors 60 and 62 provides approximately +1.3 $v_{dc}$ bias at the base of transistor 38. With these bias conditions and insufficient AGC voltage to forward bias transistor 42, transistors 38 and 40 are fully conducting and control transistor 42 is "off." In this state, maximum gain is realized for the cascade amplifier.

The circuit configuration and function of the transistors 40 and 42 combination is very similar to that of the FIG. 1 circuit. The emitters are directly connected together at a junction point C, the bases are coupled together to a common point, namely ground, via capacitors 64 and 66, the collector circuits and base bias circuits are similar to that for transistors 10 and 12 in FIG. 1, and the input signal is coupled across the base-emitter electrodes of the amplifier transistor 40. As the AGC voltage at the base of transistor 42 is increased to approach the bias at the base of transistor 40, transistor 42 will begin to conduct. With transistor 42 conducting, it shunts a portion of the signal current at the collector of transistor 38 (junction point C) to tap 63 of the matching transformer. Also, the D.C. voltage at junction point C will increase with increasing AGC signal to thereby apply a reverse bias action to the fixed base bias transistor 40. In this manner, the emitter current and signal gain of transistor 40 are reduced. Continuing the process results in transistor 40 being rendered completely nonconducting and transistor 42 being made fully conducting. The amplifier action has thus been completely transferred to the low impedance, low gain tap by the differential bias action of transistors 40 and 42.

Active negative feedback for transistor 40 is controlled by transistor 42 in a manner quite similar to that described with respect to amplifier transistor 10 and control transistor 12; a detailed discussion will be found in the aforementioned Pat. No. 3,368,156. To further enhance the linearity of the cascode amplifier operation, the bias for transistor 38 is derived from the D.C. voltage at point C, as described in the aforementioned patent.

Figure 3:
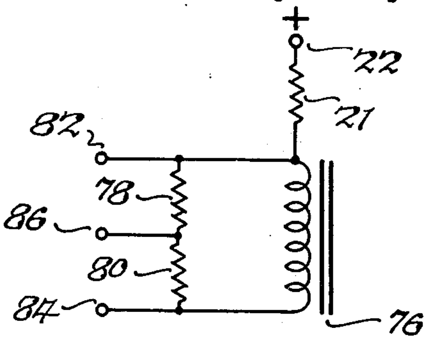
FIG. 3 is a schematic diagram of a resonant circuit including a resistor divider alternatively useful in the load circuit of FIG. 1 or 2.

FIG. 3 shows a tapped resistor divider resonant circuit arrangement which may be employed in the load circuit of FIGS. 1 and 2 in lieu of the tapped primary of a matching transformer. The resonant circuit comprises an inductor 76, which may be the primary of a matching transformer such as 20 or 48, and a pair of resistors 78 and 80 serially connected across inductor 76 to form a resistor divider. Terminal 82 of the resonant circuit is the reference terminal and represents the junction of capacitor 24 and resistor 30 in FIG. 1, or the junction of capacitor 54 and resistor 68 in FIG. 2. Resonant circuit terminal 84 is connected to the collector of transistor 10 in FIG. 1, or the collector of transistor 40 in FIG. 2. Terminal 86 is a low impedance tap of the resistor divider and is connected to the collector of transistor 12 in FIG. 1, or to the collector of transistor 42 in FIG. 2. Accordingly, the load impedance across terminals 82 and 86 is lower than the load impedance across terminals 82 and 84 by a ratio determined by the respective values of divider resistors 78 and 80. Preferably, the load impedance across terminals 82 and 86, which is the load impedance for the control transistor, is substantially lower than the impedance across terminals 82 and 84, to thereby significantly extend the power handling capabilities of the control amplifier. As illustrated in FIG. 3, the collector supply voltage for control transistor 12 is provided from terminal 22 via resistors 21 and 78. The arrangement is analogous with respect to terminal 52 and resistor 50 of FIG. 2.

Figure 4:
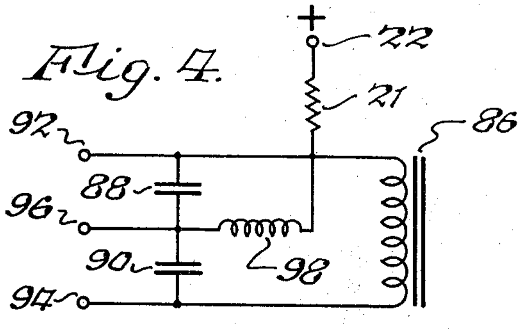
FIG. 4 is a schematic diagram of a resonant circuit including a capacitor divider alternatively useful in the load circuit of FIG. 1 or 2.

FIG. 4 shows a capacitor divider resonant circuit arrangement which is alternatively usable in the load circuitry of either FIGS. 1 or 2. The circuit includes an inductor 86, which may comprise the primary winding of a matching transformer, and a pair of capacitors 88 and 90 serially connected across the inductor. Resonant circuit terminals 92, 94 and 96 are analogous to terminals 82, 84 and 86, terminal 96 being a tap of the capacitor divider for providing a lower load impedance across the control transistor output as compared to the circuit amplifier output. In this case, the collector supply voltage for control transistor 12 is provided from terminal 22 via resistor 21 and a choke 98. The supply circuit for a FIG. 2 adaptation would be analogous.

From the foregoing it is seen that the applicant has provided an automatic gain control circuit which is particularly suitable for transistorized wide dynamic range amplifiers in that it provides an extended control range per stage with improved linearity over the entire range and improved AGC predictability. It is to be understood, however, the invention is not limited to use in transistorized circuits, but may be also embodied in analogous vaccum tube circuits. The circuit is useful in audio, video, RF or IF amplifier AGC stages, and may be implemented in a push-pull configuration. Further, it is contemplated that the circuits of FIGS. 1 and 2 are not limited to AGC applications, but may be also employed as mixer or modulator circuits by applying an RF signal at terminals 34 and 72 in lieu of an AGC voltage. A mixer implementation would preferably be push-pull because of the balance factor. A push-pull configuration would also further extend the dynamic range in AGC applications. The circuit may also be employed as an electronic switch for selectively connecting to one of two separate loads in response to the control signal, rather than using a tapped load output.

It is apparent that the emitter connections of transistors 10, 12, 40 and 42 may be AC coupled through a capacitor rather than being direct current connections. In addition, as previously mentioned, transistor 38 may comprise an FET, in which case the input signal would be applied to the gate electrode, the source electrode would be connected via resistor 58 to ground, and the drain electrode would be connected to junction point C.

A dual of this circuit technique exists in the form of low impedance amplifiers (a voltage source such as emitter followers) driving two impedance loads. In this case, the high gain tap would be the low impedance tap and the low gain tap would be the higher impedance point.

What is claimed is:

1. In combination, first and second amplifiers each having input, output and common terminals; means for coupling an input signal in parallel to the input terminals of said first and second amplifiers; means for coupling the common terminals of said first and second amplifiers to a source of reference potential; a load circuit having first, second and third terminals, said first load terminal being adapted to be coupled to a source of reference potential; means for coupling the amplified signal output of said first amplifier to the second terminal of said load circuit; means for coupling the amplified signal output of said second amplifier to the third terminal of said load circuit; the load impedance across said first and second load terminals being different from the load impedance across said first and third load terminals; and means for applying a control signal to control the gain of said first amplifier.

2. A circuit combination in accordance with claim 1 wherein said means for coupling an input signal in parallel to the input terminals of said first and second amplifiers comprises a third amplifier having input, output and common terminals, means for coupling a signal source to the input terminal of said third amplifier, means for coupling the common terminal of said third amplifier to a source of reference potential, and means connecting the output terminal of said third amplifier in parallel to the input terminals of said first and second amplifiers, said third and second amplifiers operating as a cascode amplifier stage.

3. A circuit combination in accordance with claim 1 wherein the impedance across said first and second load terminals is lower than the impedance across said first and third load terminals.

4. A circuit combination in accordance with claim 3 wherein said load circuit includes an impedance matching transformer, said first, second and third load terminals are of the primary winding of said transformer, and said second terminal is a tap of said primary between the first and third terminals thereof.

5. A circuit combination in accordance with claim 3 wherein said load circuit includes a resonant circuit comprising an inductor and a resistor divider connected across said inductor, said first, second and third load terminals are of said resonant circuit, and said second terminal is a tap of said resistor divider.

6. A circuit combination in accordance with claim 3 wherein said load circuit includes a resonant circuit comprising an inductor and a capacitor divider connected across said inductor, said first, second and third load terminals are of said resonant circuit and said second terminal is a tap of said capacitor divider.

7. A circuit combination in accordance with claim 1 wherein said first and second amplifiers are transistor amplifiers, the input, output and common terminals of each amplifier being the base, collector and emitter electrodes thereof, respectively, and said means for applying a control signal is coupled to the base electrode of said first transistor amplifier.

8. A circuit combination in accordance with claim 2 wherein: said first, second and third amplifiers are transistor amplifiers; the input, output and common terminals of each of said first and second amplifiers are the emitter, collector and base electrodes thereof, respectively; the input, output and common terminals of said third amplifier are the base, collector and emitter thereof, respectively; and said means for applying a control signal is coupled to the base electrode of said first transistor amplifier.

9. A circuit combination in accordance with claim 8 wherein said load circuit includes a resonant circuit, said first, second and third load terminals are of said resonant circuit, and said second terminal is a lower impedance tap of said resonant circuit.

References Cited

UNITED STATES PATENTS 3,447,094 5/1969 Beres ---------------- 330—29

ROY LAKE, Primary Examiner

J. B. MULLINS, Assistant Examiner

U.S. Cl. X.R.

330—20, 30